(12) United States Patent
Wu

(10) Patent No.: US 10,200,035 B2
(45) Date of Patent: Feb. 5, 2019

(54) SOUND/SILENT SWITCHABLE PHOTOELECTRIC SWITCH

(71) Applicant: Fuxi Wu, Dongguan (CN)

(72) Inventor: Fuxi Wu, Dongguan (CN)

(73) Assignee: Dongguan City Kaihua Electronics Co., Ltd., Dongguan (CN)

( * ) Notice: Subject to any disclaimer, the term of this patent is extended or adjusted under 35 U.S.C. 154(b) by 86 days.

(21) Appl. No.: 15/591,055

(22) Filed: May 9, 2017

(65) Prior Publication Data

US 2017/0244408 A1 Aug. 24, 2017

Related U.S. Application Data

(63) Continuation-in-part of application No. PCT/CN2015/093917, filed on Nov. 5, 2015.

(30) Foreign Application Priority Data

Nov. 10, 2014 (CN) .................... 2014 2 0666588 U

(51) Int. Cl.
    *H01J 40/14* (2006.01)
    *H03K 17/968* (2006.01)

(52) U.S. Cl.
    CPC ................... *H03K 17/968* (2013.01)

(58) Field of Classification Search
    CPC ... H03K 17/965; H03K 17/968; G06F 3/0234
    USPC .................................................. 250/239, 221
    See application file for complete search history.

(56) References Cited

U.S. PATENT DOCUMENTS

2014/0145954 A1* 5/2014 Wu ..................... G06F 3/03543
                                                                  345/163

* cited by examiner

*Primary Examiner* — Kevin Pyo
(74) *Attorney, Agent, or Firm* — Matthias Scholl P.C.; Matthias Scholl

(57) ABSTRACT

A photoelectric switch, including: a main body, an upper cover, an infrared tube, an elastic shading mechanism, a bridge piece, a slidable switch member, a key, a sound mode trigger block, a silent mode trigger block, and an accommodating space. The slidable switch member is transversely slidable between the main body and the upper cover. The handle of the slidable switch member protrudes out of the main body. Both the sound mode trigger block and the silent mode trigger block are up-down movably disposed on the slidable switch member and move along with the slidable switch member. When the slidable switch member is slid to one side, the sound mode trigger block is disposed right beneath the key; and when the slidable switch member is slid to the other side, the silent mode trigger block is disposed right beneath the key.

7 Claims, 16 Drawing Sheets

SOUND/SILENT SWITCHABLE PHOTOELECTRIC SWITCH

CROSS-REFERENCE TO RELATED APPLICATIONS

This application is a continuation-in-part of International Patent Application No. PCT/CN2015/093917 with an international filing date of Nov. 5, 2015, designating the United States, now pending, and further claims foreign priority benefits to Chinese Patent Application No. 201420666588.X filed Nov. 10, 2014. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND OF THE INVENTION

Field of the Invention

The invention relates to a sound/silent switchable photoelectric switch.

Description of the Related Art

Micro switches are electric switching devices that can open/close an electric circuit rapidly when being actuated. They are classified into sound micro switches and silent micro switches. Sound micro switches provide good touch experience but the sound they produce may be annoying to users. Silent micro switches, on the other hand, do not produce any sound but provide poor touch experience.

Conventional micro switches are only able to realize one or the other mode, and cannot freely switch between the two modes. In addition, the micro switches adopt metal materials as movable and static contacts which are easily oxidized, leading to malfunction of the switches.

SUMMARY OF THE INVENTION

In view of the above-described problems, it is one objective of the invention to provide a sound/silent switchable photoelectric switch that can be freely switchable between the sound mode and the silent mode according to the requirements of users.

To achieve the above objective, in accordance with one embodiment of the invention, there is provided a sound/silent switchable photoelectric switch. The switch comprises: a main body; an upper cover; an infrared tube, the infrared tube comprising a light emitting terminal and a light receiving terminal; an elastic shading mechanism, the elastic shading mechanism comprising a shading member, configured to change a light transmission direction of the infrared tube to realize light conduction or disconnection of the infrared tube; a bridge piece; a slidable switch member, the slidable switch member comprising a handle; a key; a sound mode trigger block, configured to press the elastic shading mechanism; a silent mode trigger block, configured to press the bridge piece; and an accommodating space. The upper cover is disposed on the main body, and the upper cover and the main body form the accommodating space. The infrared tube, the elastic shading mechanism, the bridge piece, the slidable switch member, the sound mode trigger block, the silent mode trigger block, and the key are all disposed in the accommodating space. One end of the bridge piece butts against the elastic shading mechanism and the other end of the bridge piece is disposed on the main body. The slidable switch member is transversely slidable between the main body and the upper cover; the handle of the slidable switch member protrudes out of the main body. The key is movable up and down, and an upper end of the key protrudes out of the upper cover. Both the sound mode trigger block and the silent mode trigger block are up-down movably disposed on the slidable switch member and move along with the slidable switch member. When the slidable switch member is slid to one side, the sound mode trigger block is disposed right beneath the key. When the slidable switch member is slid to the other side, the silent mode trigger block is disposed right beneath the key.

In a class of this embodiment, the elastic shading mechanism further comprises an extension spring. The main body comprises: a support member and a limit member. The shading member is disposed on the support member and can turn upside down. One end of the extension spring is connected to the shading member, and the other end of the extension spring is connected to the main body or the support member. The extension spring is suspended; and the sound mode trigger block is disposed above the extension spring.

In a class of this embodiment, the support member comprises: a first connecting part and a second connecting part. The shading member presses the first connecting part and is up-down rotatable relative to the support member. The shading member comprises: a third connecting part and a press position. The press position is disposed outside the third connecting part. The bridge piece presses the press position. One end of the extension spring is connected to the third connecting part, and the other end of the extension spring is connected to the second connecting part.

In a class of this embodiment, the infrared tube is a refractive type infrared tube. Both the light emitting terminal and the light receiving terminal are capsulated on a body of the infrared tube. The shading member is up-down movably disposed above the body of the infrared tube.

In a class of this embodiment, the infrared tube is a direct light transmission type infrared tube. The infrared tube comprises: an emitting tube and a receiving tube. The light emitting terminal is disposed on the emitting tube. The light receiving terminal is disposed on the receiving tube. The shading member is up-down movably disposed between the emitting tube and the receiving tube.

In a class of this embodiment, the slidable switch member comprises: a first mounting slot and a second mounting slot. The sound mode trigger block is disposed in the first mounting slot, and the silent mode trigger block is disposed in the second mounting slot.

In a class of this embodiment, the main body comprises: a base and a casing disposed on the base; both the support member and the limit member are disposed on the base; and the bridge piece is disposed on the casing.

Advantages of the sound/silent switchable photoelectric switch according to embodiments of the invention are summarized as follows: the slidable switch member is transversely slidable between the main body and the upper cover. The sound mode trigger block and the silent mode trigger block are both movable up and down, and are disposed on therefore move along with the slidable switch member. When the slidable switch member moves to one side, the sound mode trigger block is disposed right beneath the key; once the key is pressed down, the sound mode trigger block moves downward, and the shading member correspondingly moves downward, thus realizing the light conduction and a sound state. When the slidable switch member moves to the other side, the silent mode trigger block is disposed right beneath the key, once the key is pressed down, the silent mode trigger block moves downward, and the shading member correspondingly moves downward, thus realizing the light conduction and silent state. The switch of the invention is able to be flexibly switched between the sound state and the silent state according to the use requirement of the user. The product has simple operation and high flexibility, satisfies the use requirements of users and brings great convenience. In addition, by adopting the shading member to change the light transmission direction of the infrared tube, the light conduction or disconnection of the infrared tube is realized. Therefore, the conventional contact mode of the movable contact and the static contact is substituted, the imperfect contact between the movable contact and the static contact because of oxidation is effectively avoided. The switch of the invention has much better stability and longer service life.

BRIEF DESCRIPTION OF THE DRAWINGS

The invention is described hereinbelow with reference to the accompanying drawings, in which.

Figure 1:
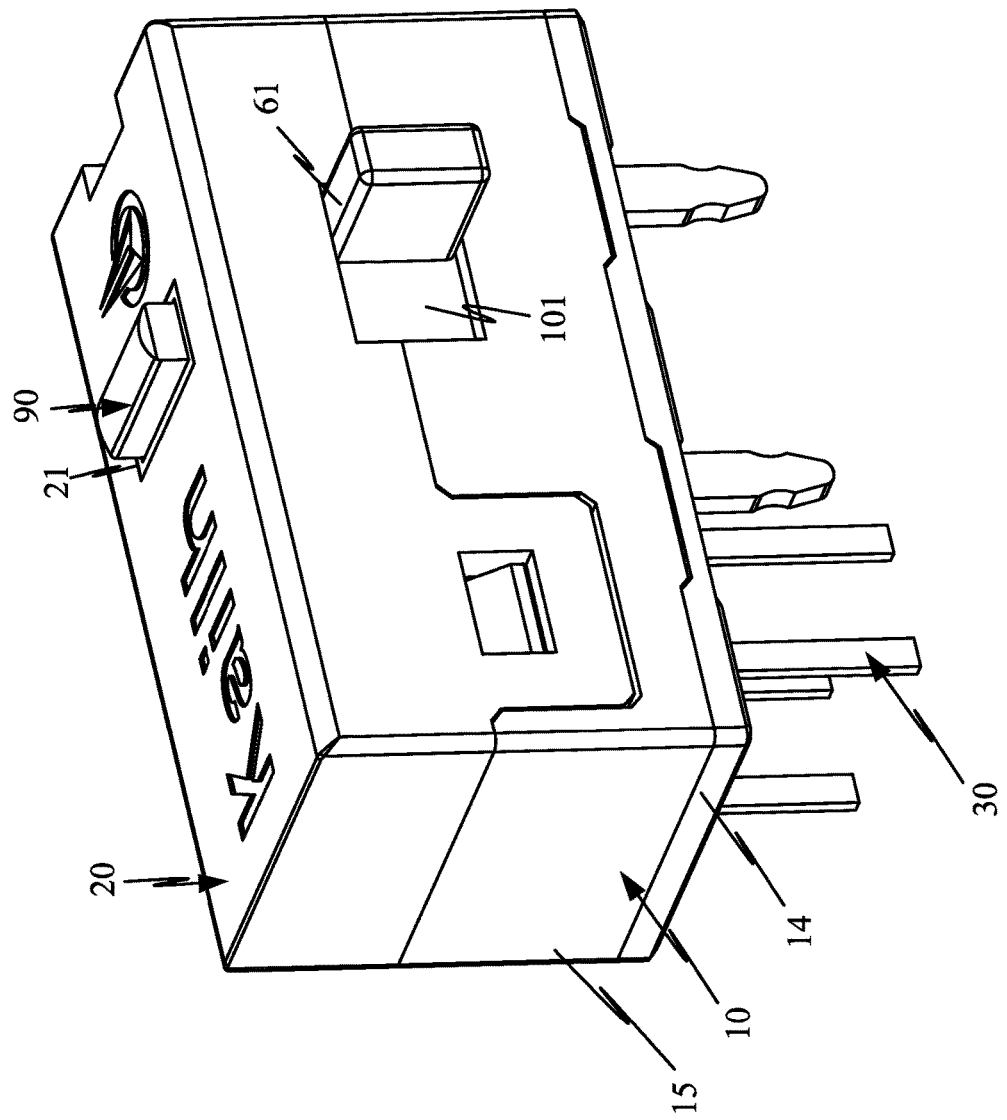
FIG. 1 is a stereogram of a sound/silent switchable photoelectric switch in accordance with Example 1.
Figure 2:
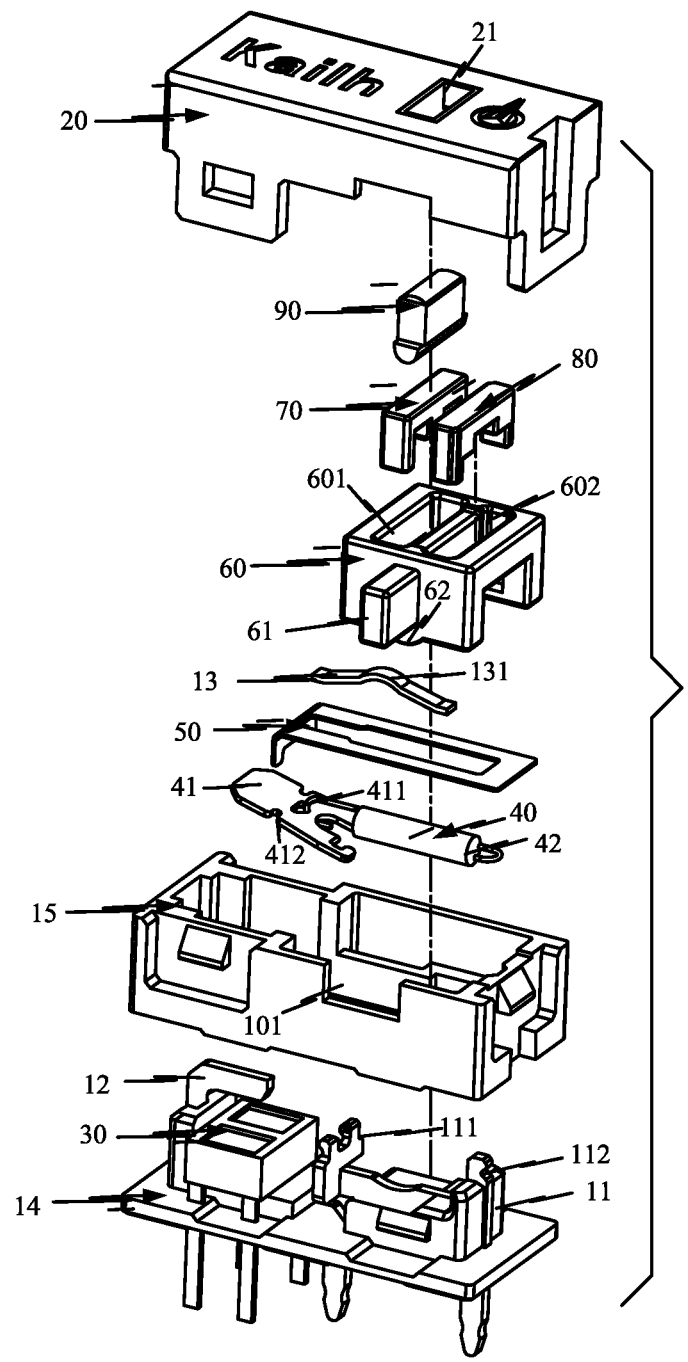
FIG. 2 is an exploded diagram of a sound/silent switchable photoelectric switch in accordance with Example 1.
Figure 3:
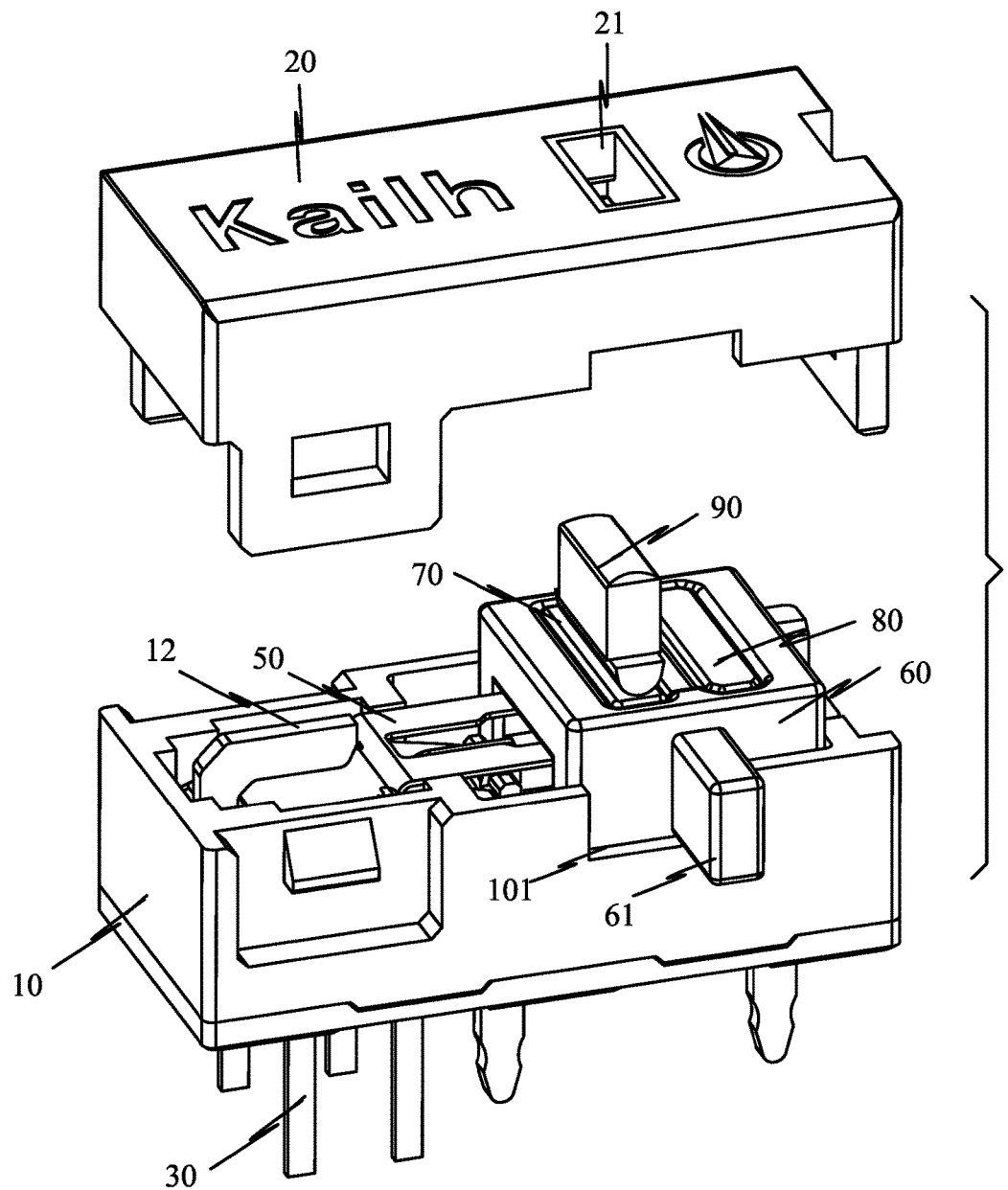
FIG. 3 is a local assembly diagram of a sound/silent switchable photoelectric switch in accordance with Example 1.

In the drawings, the following numbers are utilized: 10. Main body; 101. Chute; 11. Support member; 111. First connecting part; 112. Second connecting part; 12. Limit member; 13. Elastic piece; 131. Convex block; 14. Base; 15. Casing; 20. Upper cover; 201. Accommodating space; 21. Key slot; 30. Infrared tube; 31. Light emitting terminal; 32. Light receiving terminal; 33. Body of infrared tube; 34. Emitting tube; 35. Receiving tube; 40. Elastic shading mechanism; 41. Shading member; 411. Third connecting part; 412. Press position; 42. Extension spring; 50. Bridge piece; 60. Slidable switch member; 601. First mounting slot; 602. Second mounting slot; 61. Handle; 62. Positioning block; 70. Sound mode trigger block; 80. Silent mode trigger block; and 90. Key.

DETAILED DESCRIPTION OF THE EMBODIMENTS

For further illustrating the invention, experiments detailing a sound/silent switchable photoelectric switch are described below. It should be noted that the following examples are intended to describe and not to limit the invention.

Example 1

As shown in FIGS. 1-9, a sound/silent switchable photoelectric switch comprises: a main body 10, an upper cover 20, an infrared tube 30, an elastic shading mechanism 40, a bridge piece 50, a slidable switch member 60, a sound mode trigger block 70, a silent mode trigger block 80, and a key 90.

The main body 10 comprises a support member 11 and a limit member 12. The support member 11 comprises a first connecting part 111 and a second connecting part 112. A chute 101 is disposed on a side wall of the main body 10. An elastic piece 13 is disposed on the main body 10. The elastic piece 13 is in a vaulted shape and a middle part of the elastic piece is convex to form a convex block 131. Specifically, the main body 10 comprises a base 14 and a casing 15. The casing 15 is disposed on the base 14. The support member 11 and the limit member 12 are both disposed on the base 14, and the chute 101 is disposed on a side wall of the casing 15.

The upper cover 20 is disposed on the main body 10, and the upper cover 20 together with the main body 10 forms an accommodating space 201. An infrared tube 30, an elastic shading mechanism 40, a bridge piece 50, a slidable switch member 60, a sound mode trigger block 70, a silent mode trigger block 80, and a key are all accommodated in the accommodating space 201. A key slot 21 is disposed on the upper cover 20.

The infrared tube 30 comprises a light emitting terminal 31 and a light receiving terminal 32. The infrared tube 30 is a refractive type infrared tube. Both the light emitting terminal 31 and the light receiving terminal 32 are capsulated on a body 33 of the infrared tube 30.

The elastic shading mechanism 40 comprises a shading member 41 and an extension spring 42. The shading member 41 is disposed above the body 33 of the infrared tube 30 and beneath the limit member 12, and is movable up and down. The shading member 41 is configured to change a light transmission direction of the infrared tube 30 to realize light conduction or disconnection of the infrared tube 30. The shading member 41 is up-down rotatable and disposed on the support member 11. One end of the extension spring 42 is connected to the shading member 41, and the other end of the extension spring 42 is connected to the main body 10. It should be noted that the arrangement of the extension spring 42 is not limited as the described in the above. Optionally, one end of the extension spring 42 is connected to the shading member 41, and the other end of the extension spring 42 is connected to the support member 11. The extension spring 42 is suspended. Specifically, the shading member 41 leans against the first connecting part 111 and is up-down rotatable relative to the support member 11. The shading member 41 comprises a third connecting part 411 and a compressing positon 412. The press position 412 is disposed outside the third connecting part 411. One end of the extension spring 42 is connected to the third connecting part 411, and the other end of the extension spring 42 is connected to the second connecting part 112.

One end of the bridge piece 50 leans against the elastic shading mechanism 40, and the other end of the bridge piece 50 is disposed on the main body 10. Specifically, the bridge piece 50 is an elongated plate. One end of the bridge piece 50 leans on the press position 412, and the other end of the bridge piece 50 presses on the casing 15.

The slidable switch member 60 is transversely slidable between the main body 10 and the upper cover 20. The slidable switch member 60 comprises a handle 61. The handle 61 is disposed in the chute 101 and protrudes out of the main body 10. The slidable switch member 60 comprises a first mounting slot 601 and a second mounting slot 602. A side edge of the slidable switch member 60 protrudes downward to form a positioning block 62. When the handle is moved to one side of the chute 101, the positioning block 62 slides over and fixed by the convex block 131, so that the handle 61 is fixed at one side of the chute 101 and cannot be easily moved. When the handle is moved to the other side of the chute 101, the positioning block 62 slides over the convex block 131 so that the handle 61 is fixed at the other side of the chute 101.

The key 90 is mounted inside the key slot 21 and is up-down slidable, and an upper end of the key 90 protrudes out of the casing 20. The sound mode trigger block 70 and the silent mode trigger block 80 are both up-down arranged on the slidable switch member 60 and moves along with the slidable switch member 60. Specifically, the sound mode trigger block 70 is disposed inside the first mounting slot 601, and the silent mode trigger block 80 is disposed inside the second mounting slot 602. The sound mode trigger block 70 is disposed above the extension spring 42, and the silent mode trigger block 80 is disposed above the bridge piece 50. When the slidable switch member 60 moves to one side, the sound mode trigger block 70 is disposed right beneath the key 90. As the key 90 is pressed down, the sound mode trigger block 70 overcomes the elasticity of the extension spring 42 and moves downward, and the shading member 41 correspondingly moves downward and approaches the infrared tube 30. The infrared rays emitted from the light emitting terminal 31 is reflected by the shading member 41, then transmitted to and received by the light receiving terminal 32, thus realizing the light conduction and a sound state. When the slidable switch member 60 moves to the other side, the silent mode trigger block 80 is disposed right beneath the key 90. As the key 90 is pressed down, the silent mode trigger block 80 and the bridge piece 50 move downward, and the shading member 41 correspondingly moves downward and approaches the infrared tube 30. The infrared rays emitted from the light emitting terminal 31 is reflected by the shading member 41, then transmitted to and received by the light receiving terminal 32, thus realizing the light conduction and silent state.

Figure 4:
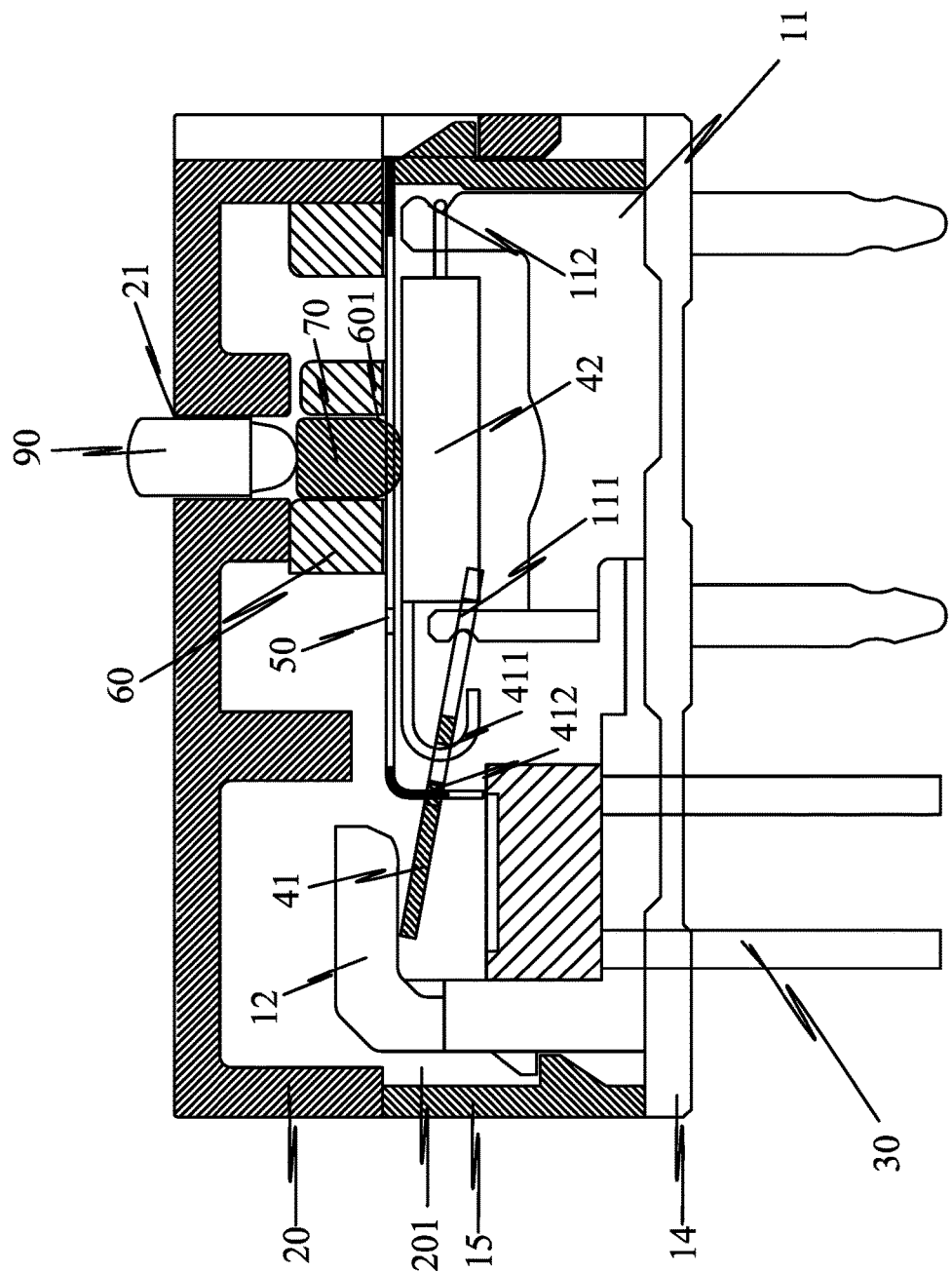
FIG. 4 is a cross sectional view of a sound/silent switchable photoelectric switch indicating a free state when a sound mode trigger block is disposed right beneath a key in accordance with Example 1.
Figure 5:
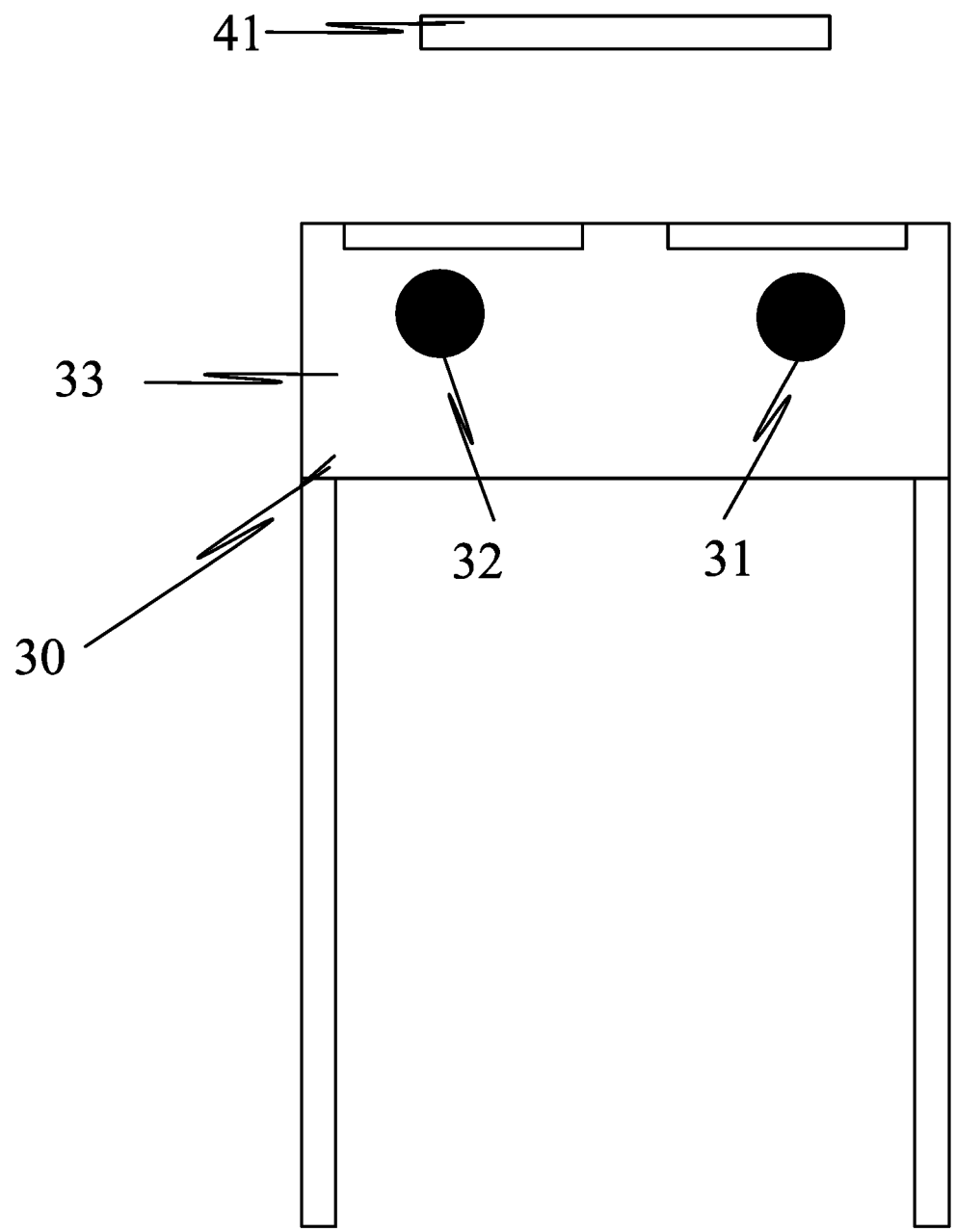
FIG. 5 is a local structure diagram of FIG. 4.
Figure 6:
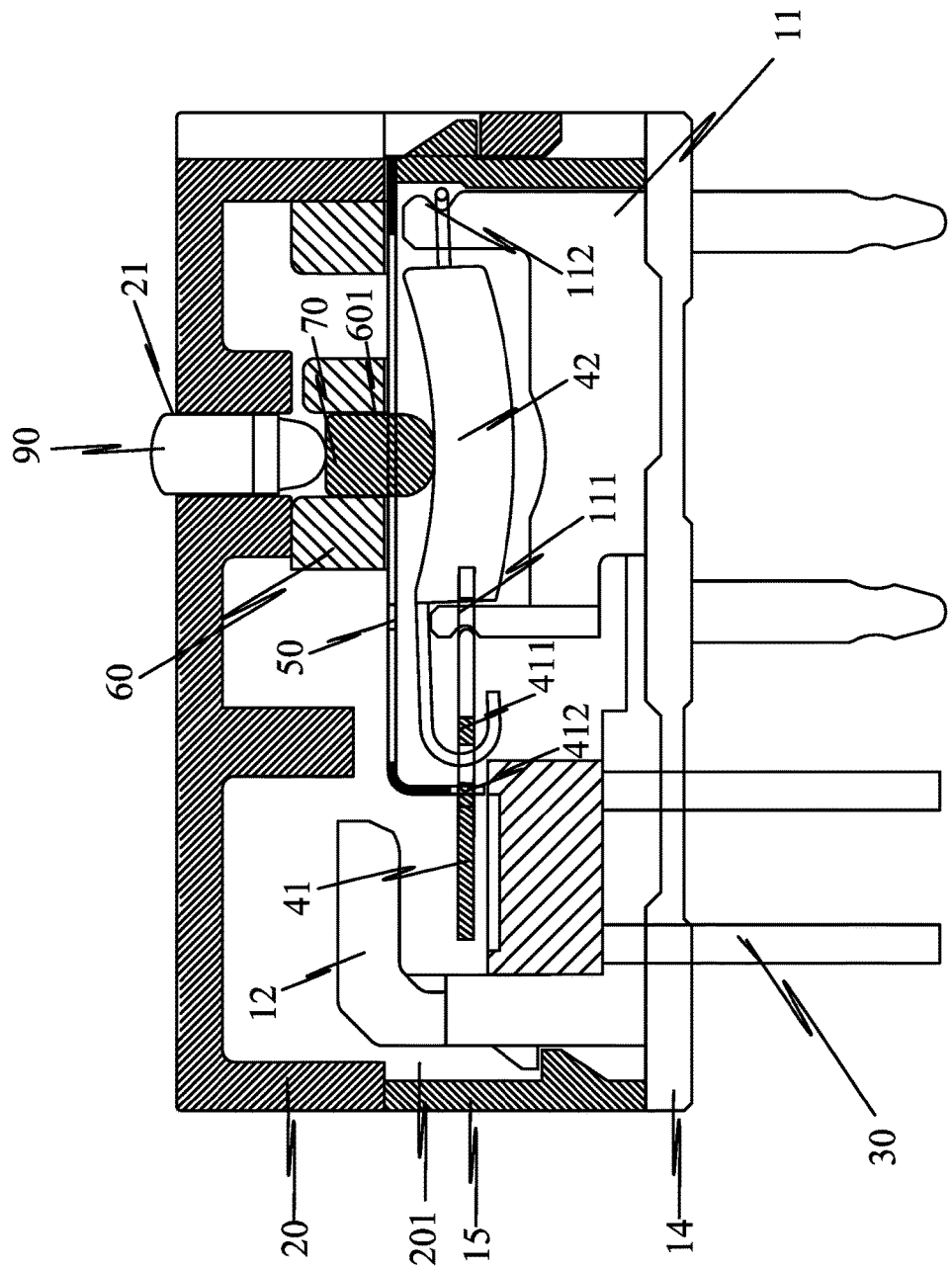
FIG. 6 is a cross sectional view of a sound/silent switchable photoelectric switch indicating a triggered state when a sound mode trigger block is disposed right beneath a key in accordance with Example 1.
Figure 7:
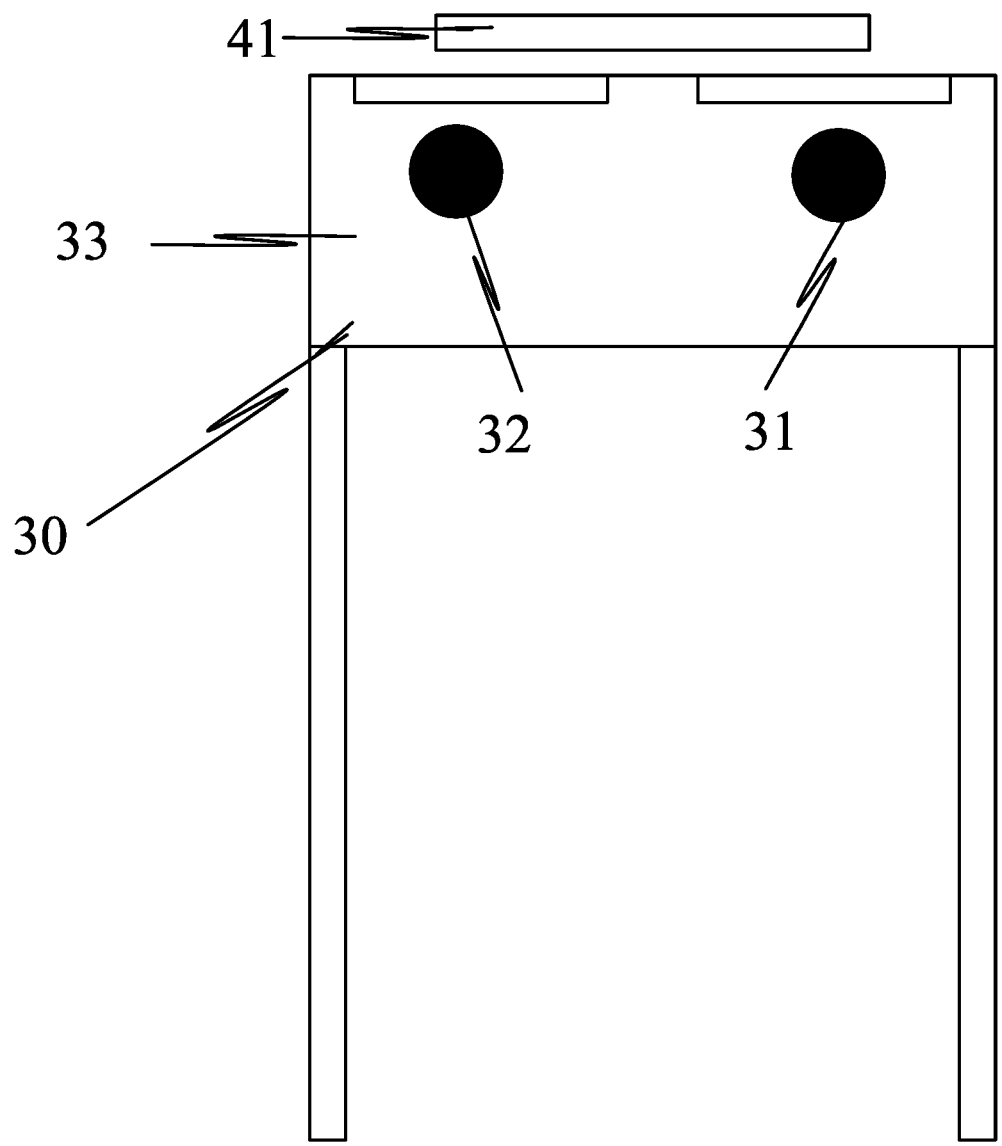
FIG. 7 is a local structure diagram of FIG. 6.

In use, when the sound state is to be realized, it only requires to move the handle 61 to one side of the chute 101 to make the sound mode trigger block 70 disposed right beneath the key 90, as shown in FIGS. 4-5, the sound mode trigger block 70 is in a free state, the shading member 41 is disposed above the infrared tube 30, and the light receiving terminal 32 is unable to receive the infrared rays emitted from the light emitting terminal 31, making the switch in the disconnected state. When the key 90 is pressed down, the sound mode trigger block 70 overcomes the elasticity of the extension spring 42 and moves downward, and the shading member 41 correspondingly moves downward and approaches the infrared tube 30. The infrared rays emitted from the light emitting terminal 31 is reflected by the shading member 41, then transmitted to and received by the light receiving terminal 32, thus realizing the light conduction and the sound state (as shown in FIGS. 6-7). When the key 90 is released, the extension spring 42 returns to the original state under the action of the intrinsic elasticity, in the meanwhile, the shading member 41 also returns upward and leaves the infrared tube 30, so that the light receiving terminal 32 is unable to receive the infrared ray emitted from the light emitting terminal 31, making the switch in the disconnected state again.

Figure 8:
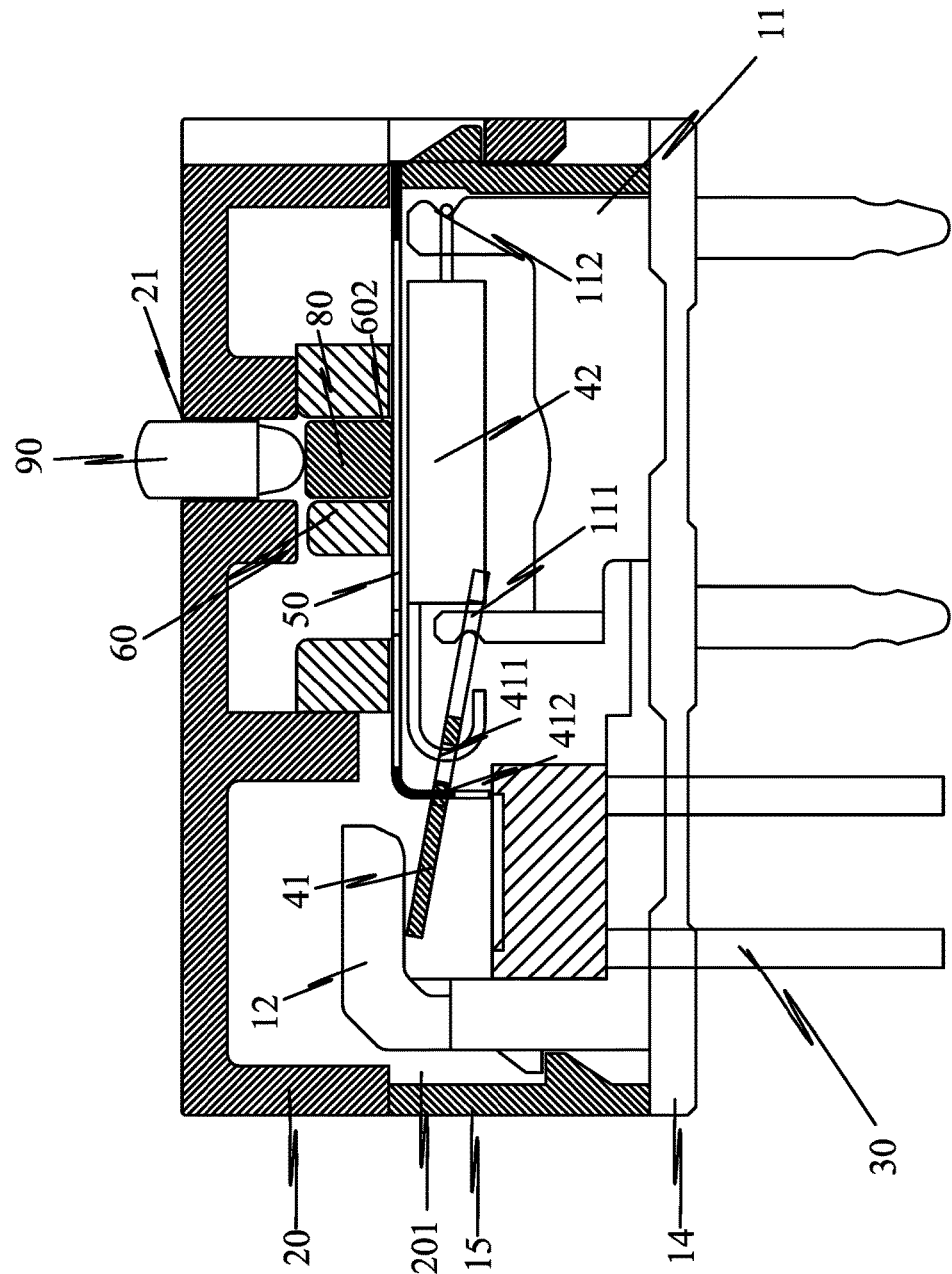
FIG. 8 is a cross sectional view of a sound/silent switchable photoelectric switch indicating a free state when a silent mode trigger block is disposed right beneath a key in accordance with Example 1.
Figure 9:
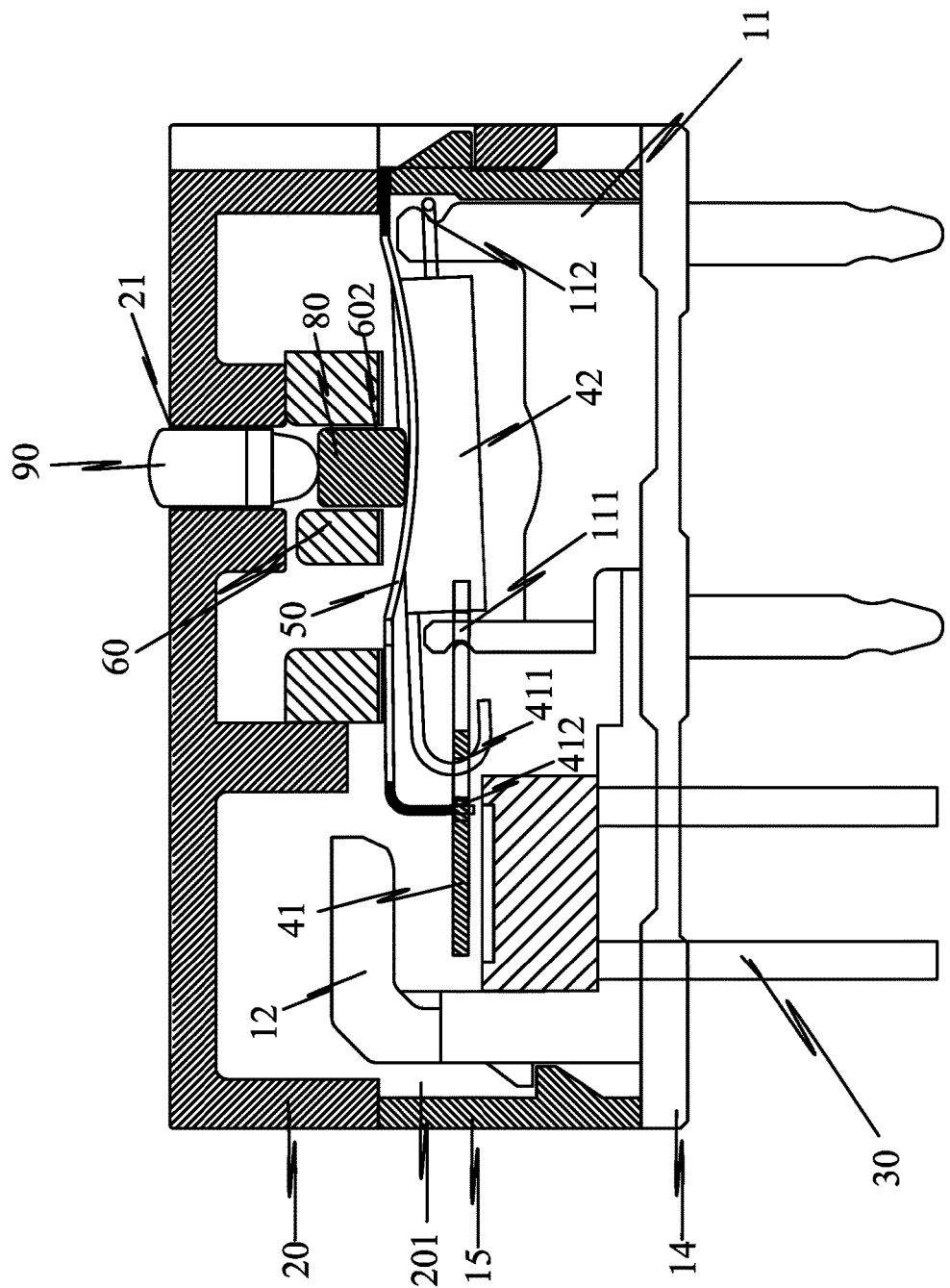
FIG. 9 is a cross sectional view of a sound/silent switchable photoelectric switch indicating a triggered state when a silent mode trigger block is disposed right beneath a key in accordance with Example 1.
Figure 10:
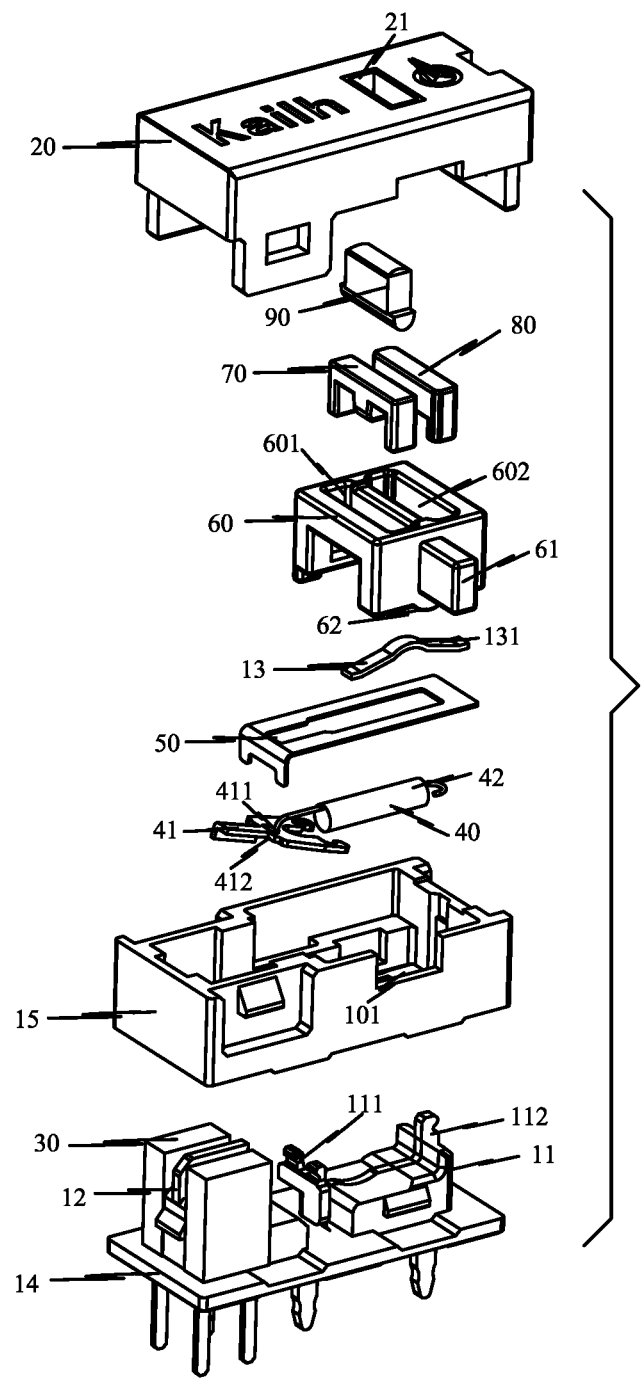
FIG. 10 is an exploded diagram of a sound/silent switchable photoelectric switch in accordance with Example 2.

When the silent state is to be realized, it only requires to move the handle 61 to the other side of the chute 101 to make the silent mode trigger block 80 disposed right beneath the key 90, as shown in FIG. 8, the silent mode trigger block 80 is in a free state, the shading member 41 is disposed above the infrared tube 30, and the light receiving terminal 32 is unable to receive the infrared rays emitted from the light emitting terminal 31, making the switch in the disconnected state. When the key 90 is pressed down, the silent mode trigger block 80, along with the bridge piece 50, moves downward, and the shading member 41 correspondingly moves downward and approaches the infrared tube 30. The infrared rays emitted from the light emitting terminal 31 is reflected by the shading member 41, then transmitted to and received by the light receiving terminal 32, thus realizing the light conduction and the silent state (as shown in FIG. 9). When the key 90 is released, the bridge piece 50 returns to the original state, in the meanwhile, the shading member 41 also returns upward and leaves the infrared tube 30, so that the light receiving terminal 32 is unable to receive the infrared ray emitted from the light emitting terminal 31, making the switch in the disconnected state again.

Example 2

As shown in FIGS. 10-16, a sound/silent switchable photoelectric switch of this example has the same structure as that of Example 1 except that:

in this example, the infrared tube 30 is a direct light transmission type infrared tube, which comprises: an emitting tube 34 and a receiving tube 35. The light emitting terminal 31 is disposed on the emitting tube 34, and the light emitting terminal 32 is disposed on the receiving tube 35. The shading member 41 is movable up and down between the emitting tube 34 and the receiving tube 35 and beneath the limit member 12.

Figure 11:
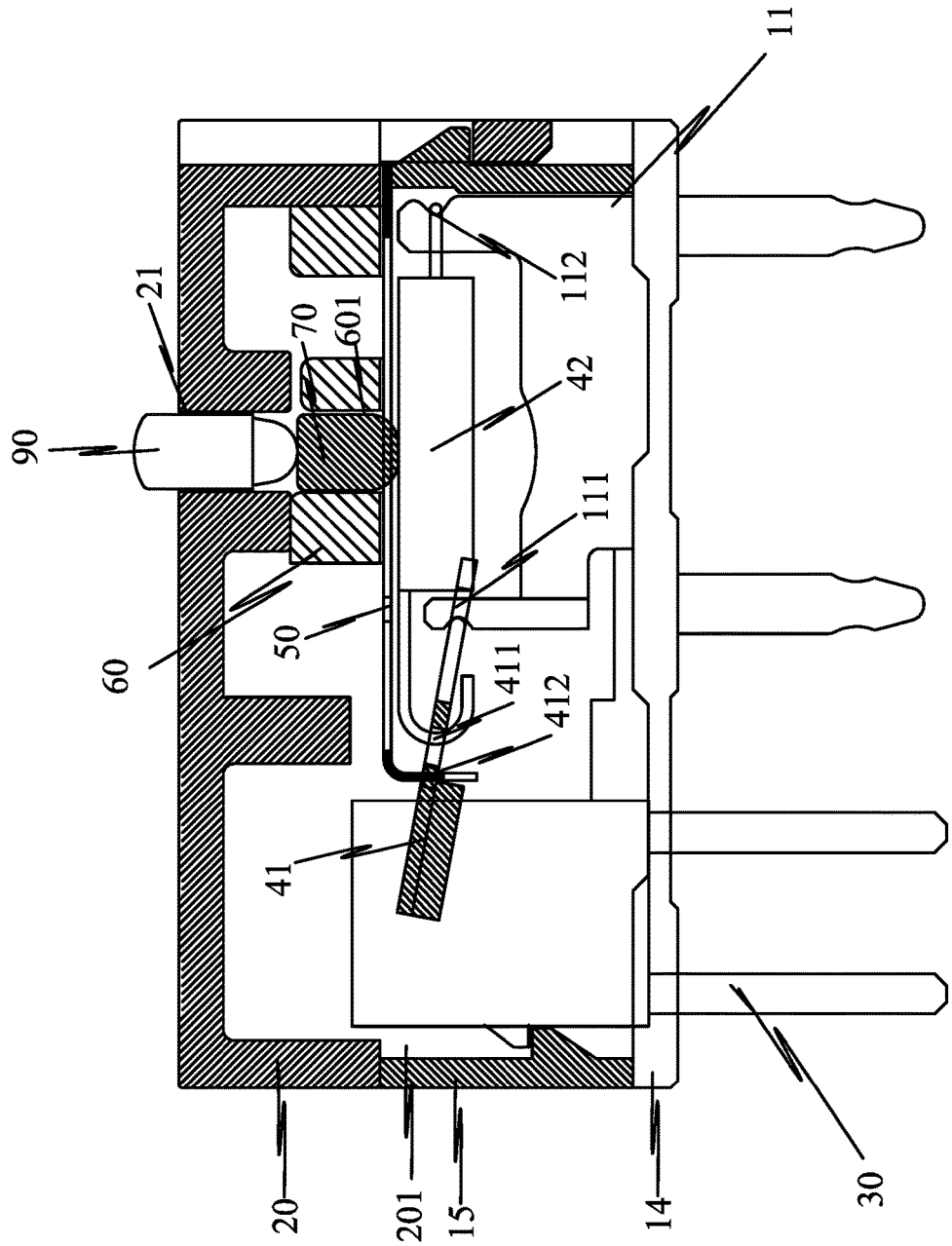
FIG. 11 is a cross sectional view of a sound/silent switchable photoelectric switch indicating a free state when a sound mode trigger block is disposed right beneath a key in accordance with Example 2.
Figure 12:
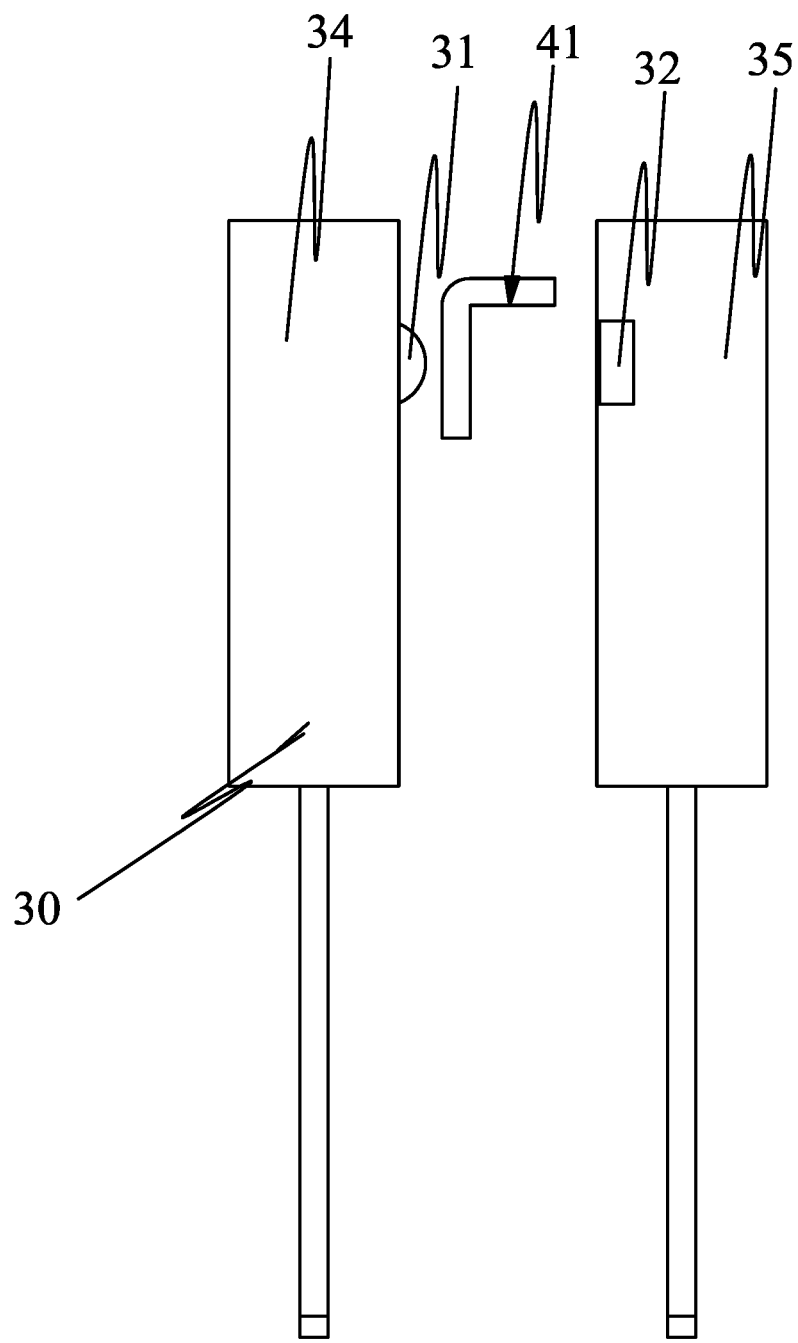
FIG. 12 is a local structure diagram of FIG. 11.
Figure 13:
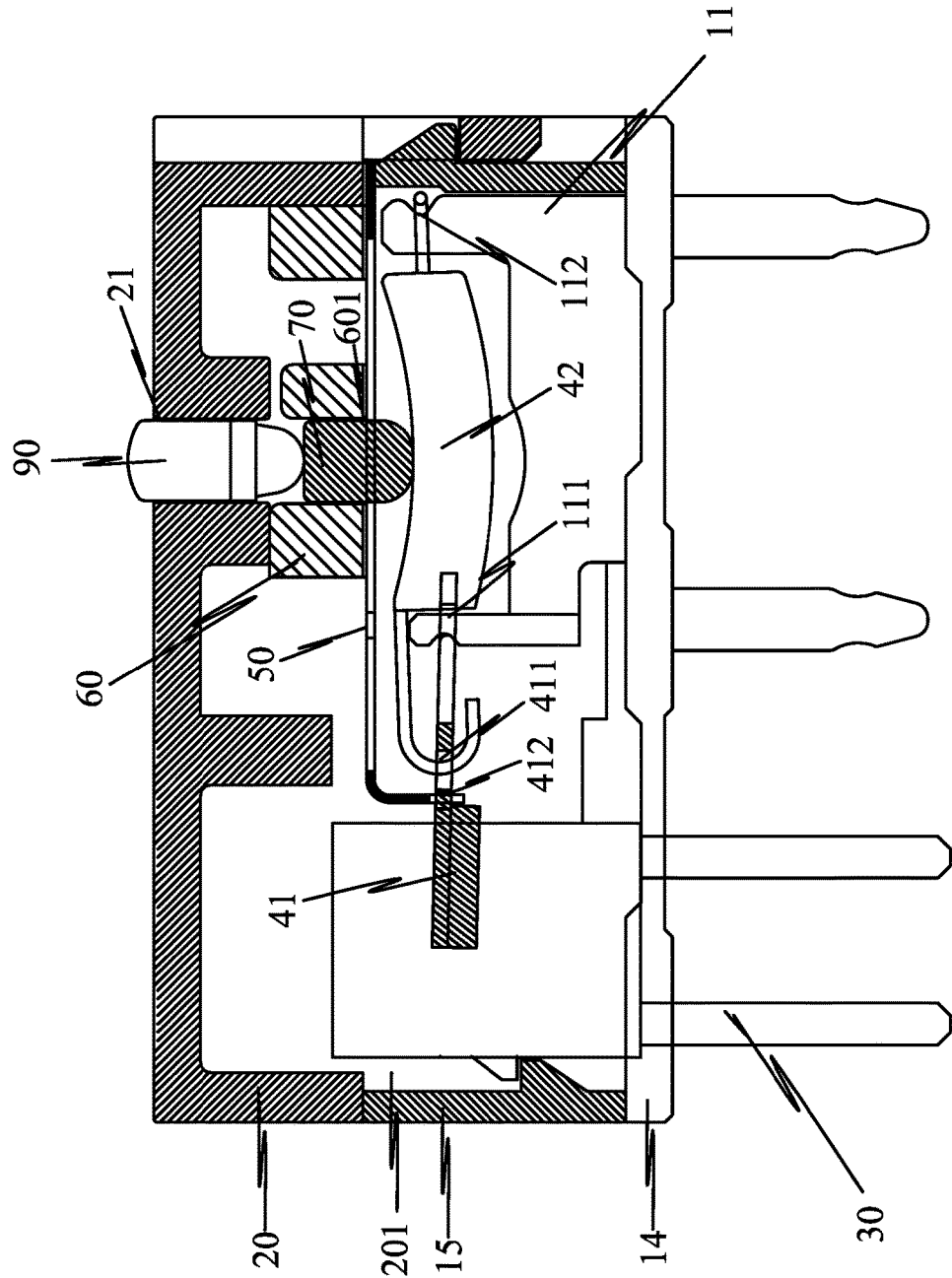
FIG. 13 is a cross sectional view of a sound/silent switchable photoelectric switch indicating a triggered state when a sound mode trigger block is disposed right beneath a key in accordance with Example 2.
Figure 14:
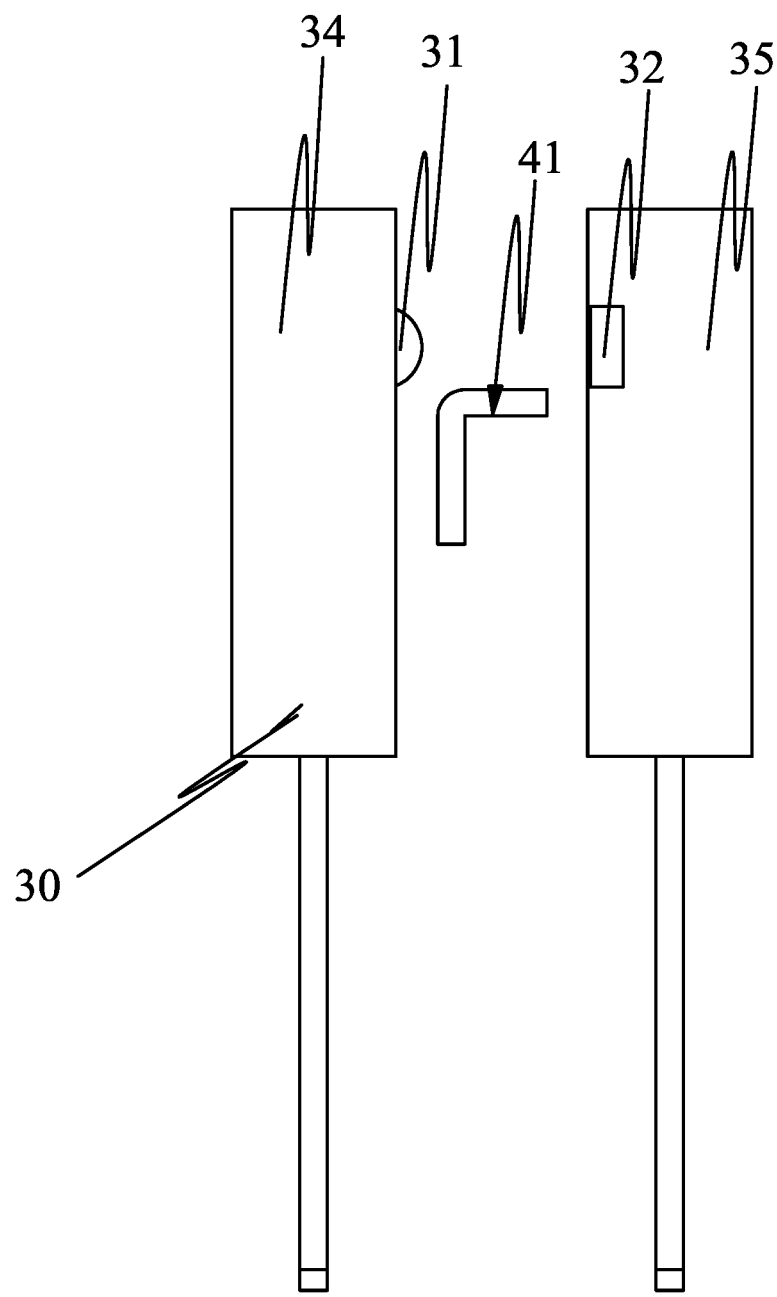
FIG. 14 is a local structure diagram of FIG. 13.

In use, when the sound state is to be realized, it only requires to move the handle 61 to one side of the chute 101 to make the sound mode trigger block 70 disposed right beneath the key 90, as shown in FIGS. 11-12, the sound mode trigger block 70 is in a free state, the shading member 41 is disposed between the emitting tube 34 and the receiving tube 35. In such condition, as shaded by the shading member 41, the infrared rays emitted from the light emitting terminal 31 cannot be received by the light receiving terminal 32, making the switch in the disconnected state. When the key 90 is pressed down, the sound mode trigger block 70 overcomes the elasticity of the extension spring 42 and moves downward, and the shading member 41 correspondingly moves downward. Thus, the infrared rays emitted from the light emitting terminal 31 is no longer shaded by the shading member 41, but directly transmitted to and received by the light receiving terminal 32, realizing the light conduction and the sound state (as shown in FIGS. 13-14). When the key 90 is released, the extension spring 42 returns to the original state under the action of the intrinsic elasticity, in the meanwhile, the shading member 41 also returns upward, the shading member 41 is disposed between the mitting tube 34 and the receiving tube 35 again, so that the light receiving terminal 32 is unable to receive the infrared ray emitted from the light emitting terminal 31, making the switch in the disconnected state again.

Figure 15:
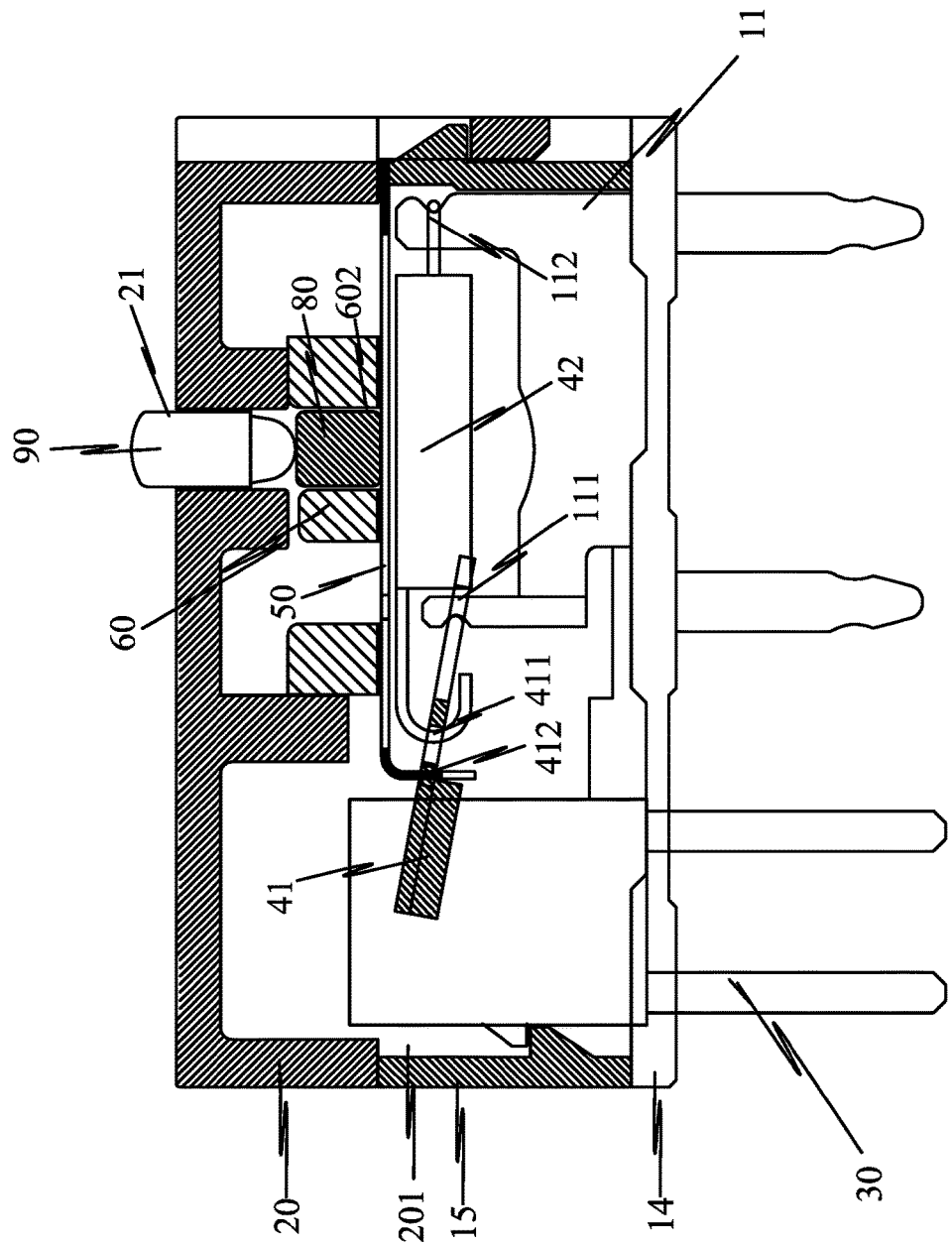
FIG. 15 is a cross sectional view of a sound/silent switchable photoelectric switch indicating a free state when a silent mode trigger block is disposed right beneath a key in accordance with Example 2.
Figure 16:
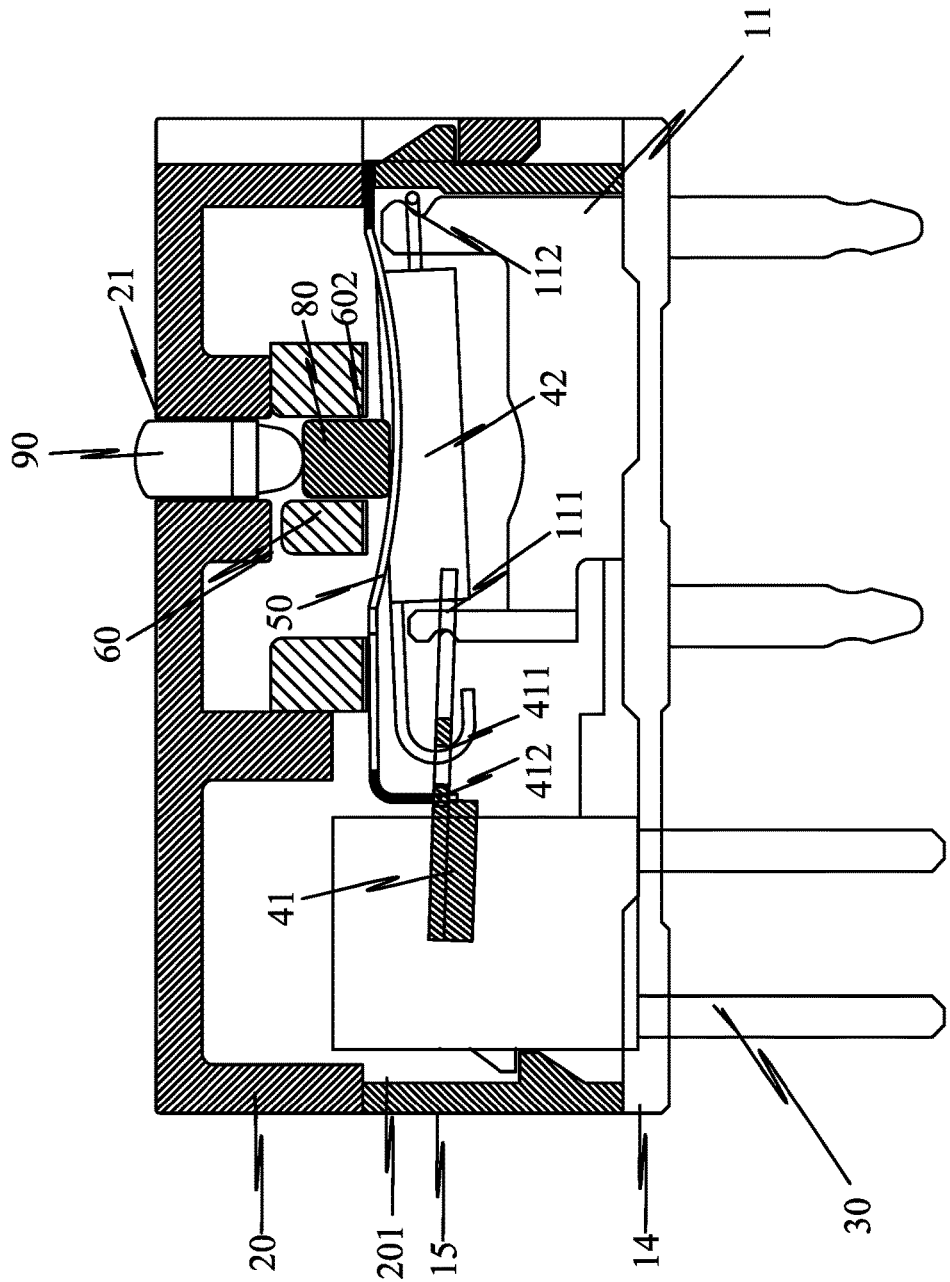
FIG. 16 is a cross sectional view of a sound/silent switchable photoelectric switch indicating a triggered state when a silent mode trigger block is disposed right beneath a key in accordance with Example 2.

When the silent state is to be realized, it only requires to move the handle 61 to one side of the chute 101 to make the silent mode trigger block 80 disposed right beneath the key 90, as shown in FIG. 15, the silent mode trigger block 80 is in a free state, the shading member 41 is disposed between the emitting tube 34 and the receiving tube 35. In such condition, as shaded by the shading member 41, the infrared rays emitted from the light emitting terminal 31 cannot be received by the light receiving terminal 32, making the switch in the disconnected state. When the key 90 is pressed down, the silent mode trigger block 80, along with the bridge piece 50, moves downward, and the shading member 41 correspondingly moves downward. The infrared rays emitted from the light emitting terminal 31 is no longer shaded by the shading member 41 but directly transmitted to and received by the light receiving terminal 32, thus realizing the light conduction and the silent state (as shown in FIG. 16). When the key 90 is released, the bridge piece 50 returns to the original state, in the meanwhile, the shading member 41 also returns upward and disposed between the emitting tube 34 and the receiving tube 35 again, so that the light receiving terminal 32 is unable to receive the infrared ray emitted from the light emitting terminal 31, making the switch in the disconnected state again.

The slidable switch member is transversely slidable between the main body and the upper cover. The sound mode trigger block and the silent mode trigger block are both movable up and down, and are disposed on therefore move along with the slidable switch member. When the slidable switch member moves to one side, the sound mode trigger block is disposed right beneath the key; once the key is pressed down, the sound mode trigger block moves downward, and the shading member correspondingly moves downward, thus realizing the light conduction and a sound state. When the slidable switch member moves to the other side, the silent mode trigger block is disposed right beneath the key, once the key is pressed down, the silent mode trigger block moves downward, and the shading member correspondingly moves downward, thus realizing the light conduction and silent state. The switch of the invention can be flexibly switched between the sound state and the silent state according to the use requirement of the user. The product has simple operation and high flexibility, satisfies the use requirements of users and brings great convenience. In addition, by adopting the shading member to change the light transmission direction of the infrared tube, the light conduction or disconnection of the infrared tube is realized. Therefore, the conventional contact mode of the movable contact and the static contact is substituted, the imperfect contact between the movable contact and the static contact because of oxidation is effectively avoided. The switch of the invention has much better stability and longer service life.

Unless otherwise indicated, the numerical ranges involved in the invention include the end values. While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A photoelectric switch, comprising:
   a) a main body;
   b) an upper cover;
   c) an infrared tube comprising a light emitting terminal and a light receiving terminal;
   d) an elastic shading mechanism, the elastic shading mechanism comprising a shading member configured to change a light transmission direction of the infrared tube to realize light conduction or disconnection of the infrared tube;
   e) a bridge piece;
   f) a slidable switch member comprising a handle;
   g) a key;
   h) a sound mode trigger block; and
   i) a silent mode trigger block; and
   wherein
   the upper cover is disposed on the main body, and the upper cover and the main body form an accommodating space; the infrared tube, the elastic shading mechanism, the bridge piece, the slidable switch member, the sound mode trigger block, the silent mode trigger block, and the key are all disposed in the accommodating space;
   one end of the bridge piece butts against the elastic shading mechanism and the other end of the bridge piece is disposed on the main body;
   the slidable switch member is transversely slidable between the main body and the upper cover; the handle of the slidable switch member protrudes out of the main body;
   the key is movable up and down, and an upper end of the key protrudes out of the upper cover;
   both the sound mode trigger block and the silent mode trigger block are movably disposed on the slidable switch member and are movable up and down along with the slidable switch member; and
   in use, when the slidable switch member is slid to one side, the sound mode trigger block moves right beneath the key to press the elastic shading mechanism; and when the slidable switch member is slid to the other side, the silent mode trigger block moves right beneath the key to press the bridge piece.

2. The switch of claim 1, wherein the elastic shading mechanism further comprises an extension spring; the main body comprises: a support member and a limit member; the shading member is disposed on the support member and capable of turning upside down; one end of the extension spring is connected to the shading member, and the other end of the extension spring is connected to the main body or the support member; the extension spring is suspended; and the sound mode trigger block is disposed above the extension spring.

3. The switch of claim 2, wherein the support member comprises: a first connecting part and a second connecting part; the shading member presses the first connecting part and is up-down rotatable relative to the support member; the shading member comprises: a third connecting part and a press position; the press position is disposed outside the third connecting part; the bridge piece presses the press position; and one end of the extension spring is connected to the third connecting part, and the other end of the extension spring is connected to the second connecting part.

4. The switch of claim 1, wherein the infrared tube is a refractive type infrared tube; both the light emitting terminal and the light receiving terminal are capsulated on a body of the infrared tube; and the shading member is up-down movably disposed above the body of the infrared tube.

5. The switch of claim 1, wherein the infrared tube is a direct light transmission type infrared tube; the infrared tube comprises: an emitting tube and a receiving tube; the light emitting terminal is disposed on the emitting tube; the light receiving terminal is disposed on the receiving tube; and the shading member is up-down movably disposed between the emitting tube and the receiving tube.

6. The switch of claim 1, wherein the slidable switch member comprises: a first mounting slot and a second mounting slot; the sound mode trigger block is disposed in the first mounting slot, and the silent mode trigger block is disposed in the second mounting slot.

7. The switch of claim 2, wherein the main body comprises: a base and a casing disposed on the base; both the support member and the limit member are disposed on the base; and the bridge piece is disposed on the casing.

\* \* \* \* \*